United States Patent [19]

Chow et al.

[11] Patent Number: 4,474,864

[45] Date of Patent: Oct. 2, 1984

[54] METHOD FOR DOSE CALCULATION OF PHOTOLITHOGRAPHY PROJECTION PRINTERS THROUGH BLEACHING OF PHOTO-ACTIVE COMPOUND IN A PHOTORESIST

[75] Inventors: Ming-Fea Chow, Poughquag; Alexander D. Lopata, Fishkill; Christopher F. Lyons, Lagrangeville; Robert C. McIntosh, Brewster; Anthony F. Scaduto, Newburgh, all of N.Y.

[73] Assignee: International Business Machines Corporation, Armonk, N.Y.

[21] Appl. No.: 512,281

[22] Filed: Jul. 8, 1983

[51] Int. Cl.³ .................. G03C 5/18; G03C 5/16; G03C 5/08; G03F 7/20
[52] U.S. Cl. .................... 430/30; 355/77; 356/51; 430/142; 430/327
[58] Field of Search ................. 430/30, 142, 327, 328, 430/21; 355/77; 356/51

[56] References Cited

U.S. PATENT DOCUMENTS

| | | | |
|---|---|---|---|
| 3,046,118 | 7/1962 | Schmidt | 430/193 |
| 3,077,401 | 2/1963 | van der Grinten et al. | 430/30 |
| 3,397,315 | 8/1968 | Johnston | 430/142 |
| 3,953,135 | 4/1976 | Levy et al. | 356/175 |
| 3,977,872 | 8/1976 | Hellmig | 430/30 |
| 4,128,338 | 12/1978 | Wong | 356/432 |
| 4,212,395 | 7/1980 | Canavello | 430/326 |
| 4,259,430 | 3/1981 | Kaplan et al. | 430/191 |

Primary Examiner—Richard L. Schilling
Attorney, Agent, or Firm—Sughrue, Mion, Zinn, Macpeak and Seas

[57] ABSTRACT

A process for setting the exposure speed of photolithography instruments is described, using a method of dosimetry based on photoactive compound bleaching of photoresist. A curve of light absorbance to exposure speed and a calibration curve of light absorbance to dose are determined for a photoresist. The exposure speed for any desired degree of resist bleaching can be set using the first curve, and the exposure speed for a predetermined dosage can be set by determining the common light absorbance value on the exposure speed and dosage curves.

7 Claims, 2 Drawing Figures

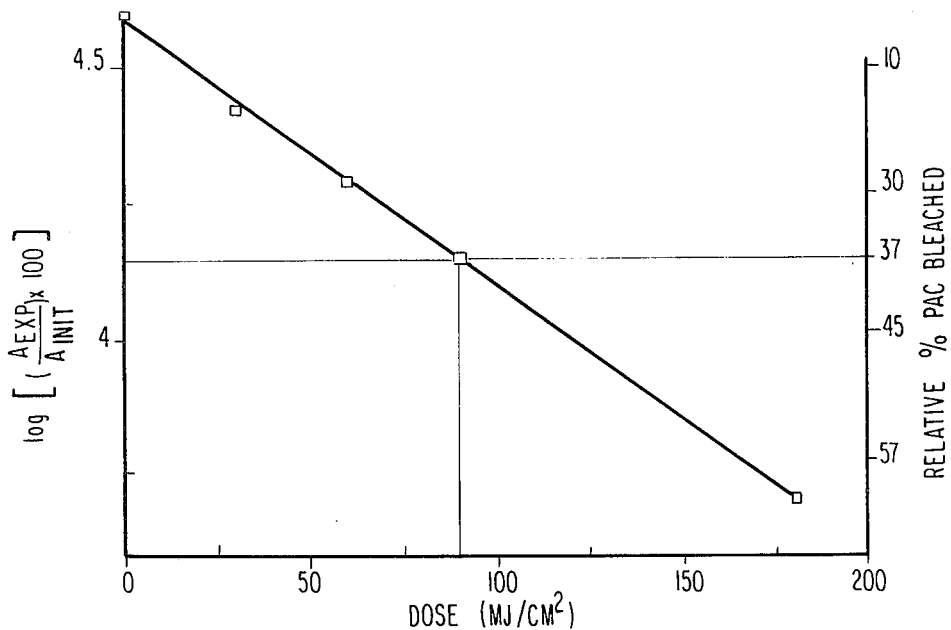
FIG.1 CALIBRATION CURVE FOR 0.27 MOLAL PHOTORESIST LOT EXPOSED AT 310 NM
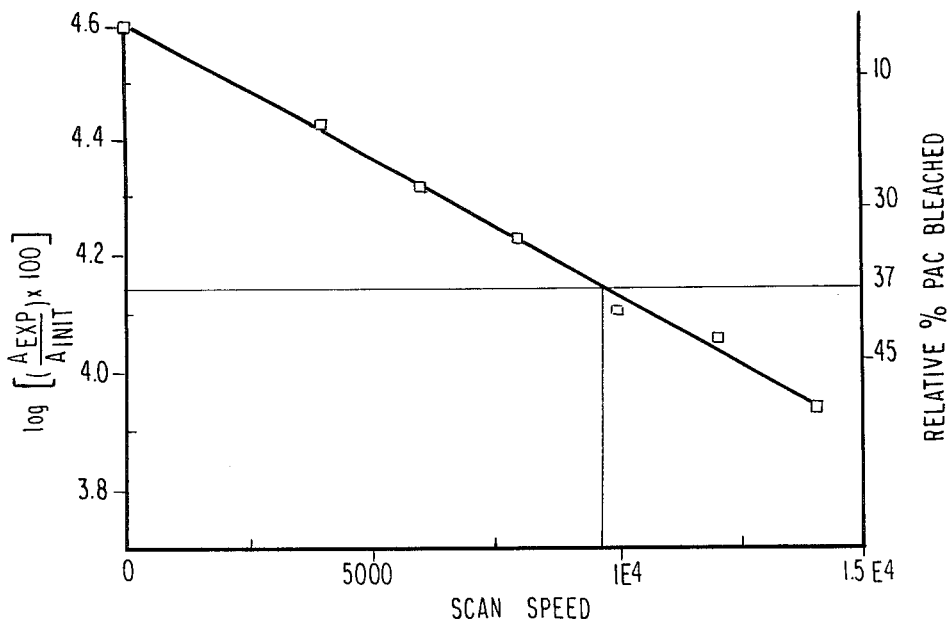
FIG.2 0.27 MOLAL PHOTORESIST LOT BLEACHING USING A PHOTOLITHOGRAPHY PROJECTION PRINTER WITH 0-20 FILTER

METHOD FOR DOSE CALCULATION OF PHOTOLITHOGRAPHY PROJECTION PRINTERS THROUGH BLEACHING OF PHOTO-ACTIVE COMPOUND IN A PHOTORESIST

BACKGROUND OF THE INVENTION

1. Field of the Invention

The present invention relates to a method for exposure dose setting in photolithographic instruments.

2. Description of the Prior Art

Photolithographic instruments are used in the manufacture of integrated circuits. In this technology, wafers of silicon are coated with a photoresist material. When exposed to ultraviolet light the photoresist material is polymerized into a hard tenacious coating and the unexposed portions of the layer may easily be removed by means of a solvent or developer. By means of a mask or master which is opaque except for a pattern of transparent lines, the photoresist coating may be exposed to light in a pattern conforming to a circuit element or elements. A wafer may be exposed to successive masks, each of which exposes a new photoresist coating in a different pattern on its surface, forming additional circuit elements. The optical images formed on the wafer in successive exposures must, however, be closely controlled in relative position, for example, by use of patterning exposure tools, such as projection printers, 1x scanning tools, reduction scanning tools, stepping and contact instruments, broadly defined as photolithography instruments.

Typical photolithography projection printers used in exposing photoresist in such a manner are described in U.S. Pat. Nos. 4,011,011, to Hemstreet et al., 4,068,947 to Buckley et al., 3,951,546 to Markle, 3,937,556 to Newell, 3,952,217 to Rawllings, 4,248,508 to Watkin, 3,957,364 to Markle et al., and 4,240,702 to Casas. These printers operate without projection lenses made up of refractive elements, instead exposing the wafer through a mask by scanning the mask with an illumination source, preferably, a UV (Ultra Violet) source. Control of exposure times in patterning exposure tools is obtained by control of the speed of the scanning motion and of the width of the area illuminated on the mask, or by varying shutter speeds.

It is necessary to control the exposure (the amount of energy reaching the photoresist) carefully in order to ensure the quality of the developed image. As the amount of exposure of a photoresist layer to UV light is increased, the photoresist layer is progressively bleached. It is well known in the art that good process lithography occurs at definite levels of bleaching, for example, at about 37% relative photoactive compound (PAC) bleaching for a 0.27 molal diazoketone/novolac positive resist. However, because of fluctuations of scan speed and lamp intensity, it is quite difficult to reproduce the optimum dose on a given day using known photolithographic instruments which have no internal dose monitor.

Previous methods of dosimetry for UV photolithographic instruments are well known. For instance photodiode probes responding to all emission lines for the mode (i.e., UV-4, UV-3, or UV-2) being employed may be used. It is also known to use commercial dosimeter film, whereby the film, in the form of a strip taped onto the wafer, is exposed to varying dose amounts. However, because of the limited light sensitivity of available films, this method cannot be used in all exposure modes, that is, for all wavelengths of ultraviolet light. Furthermore, a calibration curve must be generated for each lot of film since lot-to-lot variations may occur. Moreover, this process, which involves darkening of a light-sensitive material rather than PAC bleaching, is only indirect.

Another known method of dosimetry involves exposing a test photoresist layer through a mask which provides images of varying percent transmittance. After development, the photolithographic instrument dose is approximated for a known process window via SEM (Scanning Electron Micrograph) image analysis. This method, however, is not quantitative and is dependent on the type of photoresist, developer and processing. It also requires a scanning electron microscope.

The known end point detection method of dosimetry involves the exposure of a test photoresist layer through a blank quartz mask after which a laser endpoint detection is run to determine dissolution curves. The photolithographic tool dose is approximated for a known process window via the laser endpoint detection dissolution data base. This method has the disadvantages that a laser endpoint detection system is required, it is not quantitative and is dependent on the type of photoresist, developer and laser endpoint detection procedure.

Photoresist image analysis is also known as a method of dosimetry. After exposure and development, the relative dose is estimated as a function of line width from optical or electron microscopy techniques. A photolithographic tool dose can be approximated from an SEM image data base. Disadvantages of this method are that it requires a SEM or other microscope is not quantitative, and is dependent on the type of photoresist, developer and processing.

Accordingly, an object of the invention is to provide a method for determining the mid-, near- or deep UV exposure dose of a patterning exposure instrument as a function of scan speed or shutter speed.

Another object of the invention is to provide a method of dosimetry which has low measurement error and which offers a measurement directly correlated with photoresist lithography usage.

Yet another object of the invention is to provide a method for matching a photolithographic instrument performance with each lot or loading of photoresist.

A further object of the present invention is to provide a simplified method of dosimetry using photoresist coated discs which do not require the use of adhesion promoters or prebake.

SUMMARY OF THE INVENTION

The present invention overcomes the difficulties of determining exposure for photolithographic projection instruments without built-in photoelectric probes. More specifically, the above and other objects have been attained by a method for determining the dose per exposure time of a photolithographic instrument by measuring the UV absorbance of a test photoresist layer deposited on a quartz disc. The dose is determined by comparing the bleaching value on a particular day for a particular tool to that of a calibration curve of bleaching versus dose. By the present method, photoresist response is specifically matched to the effective total dose for that resist, over the entire effective range of wavelengths in the exposure tool used.

By the present method, the optimal exposure speed on a given instrument to achieve the desired relative percent PAC bleached value for a given resist may be determined by simple direct reference to the curve generated for that photolithography production instrument.

Although it may be desirable to generate a new calibration curve for each lot of photoresist, it has been determined that lot-to-lot variations of photoresist made to narrow specifications are less than about 3%. Consequently, acceptable production process control can be achieved without the necessity of new calibration curves for each lot of resist. By the present method, it is possible to determine the exposure speed in any useful UV exposure range, e.g., from about 220—500 nanometers, for any photoresist. Exposure speed refers to the method for controlling exposure on a given patterning exposure tool, e.g., by varying scanning speed or shutter speed.

BRIEF DESCRIPTION OF THE DRAWINGS

FIG. 1 shows a typical calibration curve obtained by exposing half wafers coated with photoresist to ultraviolet light of 310 nm while measuring the dose using an exposure meter with a 310 nm probe; and FIG. 2 shows typical curves showing percent PAC bleached plotted against scan speed obtained by exposing half wafers coated with photoresist at varying scan speeds on a photolithographic printer equipped with an 0-20 filter.

DESCRIPTION OF THE PREFERRED EMBODIMENTS

The major method steps of the present invention include the following:

First, quartz wafers are coated with a photoresist layer. Half of the coated surfaces of the wafers are then covered with an opaque material such as aluminum. Next, several half-covered wafers are exposed to ultraviolet light of a known wavelength on a laboratory instrument equipped with a photodiode measuring probe to determine the amount of dosage. The exposure of each coated wafer is varied, e.g., by use of different shutter speeds. The relative percent PAC bleached is calculated by comparing the absorbance of the exposed and unexposed portions of each wafer as determined by a UV spectrophotometer. A calibration curve is constructed plotting relative percent PAC bleached against the dose measured. An example of such a calibration curve is shown in FIG. 1.

Then, half-covered wafers coated with the same type of photoresist are exposed at several different exposure speeds on a patterning exposure tool without an internal dose measuring device. Relative percent PAC bleached is determined as above by UV spectrophotometry, and a linear curve of relative percent PAC bleached is plotted against exposure speed. An example of such a curve is shown in FIG. 2.

In one preferred embodiment, the actual dose (in mJ/cm$^2$) is determined quantitatively in terms of exposure speed on a given photolithography instrument by establishing from the two curves the dose and exposure speed necessary to obtain the same relative percent PAC bleached in the resist. This absolute determination is useful for comparison of different resists or processes, and provides, for example, a convenient and reliable quality check method for a given lot of resist.

Absolute quantitative measurement of the dosage associated with any given scan or shutter speed is useful in many ways. For example, a photolithographic tool for which a calibration curve is generated may be used to expose resists of different chemical composition, concentration or thickness at any known optimum dosage without the necessity of exposing new test wafers. Similarly, it is possible to directly compare performance of different patterning exposure tools or to recreate any desired dosage on different instruments.

Having thus described in broader terms embodiments of the present invention, the following more detailed description is provided with reference to specific examples.

EXAMPLE I

Several 1/16 inch thick optical grade quartz discs were coated with 0.27 molal ortho-napthoquinone diazide/novolac type photoresist to 0.49 ±0.02 OD at 405 nm by spinning at 6K rpm. An adhesion promotor was not used on the quartz discs and the resist was not baked on the quartz discs.

Four wafers thus prepared were covered on half their surface with aluminum foil (0% T) and were exposed on a laboratory instrument equipped with a photodiode probe to UV light having a wavelength of 310 nm at measured doses of approximately 30, 60, 90 and 180 mJ/cm$^2$.

The UV absorbance spectra of each disc half were measured at 405 nm on a UV spectrophotometer. 405 nm was selected in order to eliminate absorbance due to the resin component of the photoresist since at this wavelength the only absorbance measured is due to PAC. A dual-beam spectrophotometer was used with an optically matched blank quartz wafer to eliminate absorbance due to the substrate. The relative percent bleached was calculated by the expression:

$$\text{Relative \% PAC bleached} = \left(1 - \frac{A_{EXP}}{A_{INIT}}\right) \times 100,$$

where $A_{EXP}$=Absorbance of exposed wafer half and $A_{INIT}$=Absorbance of unexposed wafer half.

A calibration curve for this lot of resist (FIG. 1) was made by plotting on the Y-axis $$\log\left[\left(\frac{A_{EXP}}{A_{INIT}}\right) \times 100\right]$$

versus the measured dose in mJ/cm$^2$ on the X-axis and a scale of percent PAC bleached values, corresponding to $$\log\left[\left(\frac{A_{EXP}}{A_{INIT}}\right) \times 100\right]$$

values, was added to the Y-axis on the opposite side of the graph.

To determine the optimum dose for a printing process for a given photolithographic instrument, a quartz blank having one half covered with aluminium foil (0% T) was used instead of a pattern mask in the photolithographic instrument. Photoresist coated wafers were then exposed through mid-UV (UV-3) and near-UV (UV-4) filters, simulating the wavelength of a typical photolithographic production process. The wafers were exposed at six arbitrary scan speeds of interest. Relative percent bleaching was determined as above by measuring the absorbances of the half-covered wafers using a dual-beam UV spectrophotometer. A linear curve of scan speed against $$\log\left[\left(\frac{A_{EXP}}{A_{INIT}}\right) \times 100\right]$$

was plotted. This process was repeated on different days for different lots. The results are shown in FIG. 2.

In order to determine the scan speed required on a given day for a given machine to permit the optimum dosage, using the method of the present invention, it is only necessary to determine the point on the curve made for that machine as described above corresponding to the desired 37% PAC bleached value. The appropriate scan speed for that optimum dosage can thus be conveniently determined. In FIG. 2, the scan speed required to obtain 37% relative PAC bleaching is shown to be about 9.4K.

The determination is also quantitative, since the dose in $mJ/cm^2$ for the 37% relative PAC bleached value is given by the calibration curve. Referring to FIG. 1, the dose necessary to obtain the same 37% relative PAC bleached value (i.e., the dose at 9.4K) is approximately 92-93 $mJ/cm^2$. The scan speeds required to attain this dosage on other days and for other lots are easily determined by referring to other curves generated for those conditions.

It is to be understood that the invention is not limited to the particular details described, for obvious modifications will occur to a person skilled in the art. For example, the photoresist is not limited to the particular type mentioned, and the method can be applied to many different UV exposure instruments and all UV exposure ranges.

We claim:

1. A method for selecting the exposure speed of a photoresist-coated surface comprising the steps of:
   (a) coating a plurality of quartz wafers with a photoresist layer, and covering a portion of the coated surfaces of said quartz wafers with an optically opaque material;
   (b) subjecting said wafers to a plurality of exposure speeds to ultraviolet light on a photolithography production instrument;
   (c) determining relative percent photoactive compound bleached values by measuring and comparing the absorbance of the exposed and unexposed portions of each of said wafers;
   (d) plotting a curve of relative percent photoactive compound bleached values against said exposure speeds; and
   (e) setting an exposure speed of a photolithography instrument by determining from the curve the exposure speed corresponding to any desired relative percent photoactive compound bleached value.

2. A method for quantitatively determining the exposure dose associated with any exposure speed of a patterning exposure tool comprising:
   (a) constructing a curve by:
      (i) coating a plurality of quartz wafers with a photoresist layer, and covering a portion of the coated surfaces of said quartz wafers with an optically opaque material;
      (ii) subjecting said wafers to exposure to ultraviolet light at a plurality of exposure speeds on a photolithography production instrument;
      (iii) determining relative percent photoactive compound bleached values by measuring and comparing the absorbance of the exposed and unexposed portions of each of said wafers;
      (iv) plotting a curve of relative percent photoactive compound bleached values against said exposure speeds; and
   (b) constructing a calibration curve by the further steps of:
      (i) coating a plurality of quartz wafers with a photoresist layer, and covering a portion of the coated surfaces of said quartz wafers with an optically opaque material;
      (ii) subjecting said wafers to exposure to ultraviolet light at a plurality of known wavelengths and dosages;
      (iii) measuring the optical absorbance of exposed and unexposed portions of each of said wafers, and determining the relative percent photoactive compound bleached for each of said wafers by comparing the optical absorbance of the exposed and unexposed portions of each of said wafers;
      (iv) plotting said relative percent photoactive compound bleached values against said dose measured values; and
   (c) determining the exposure dose at any said exposure speeds by determining the relative percent photoactive compound bleached at any exposure speed from the first curve and determining the exposure dose corresponding to that relative percent photoactive compound bleached value from the calibration curve.

3. The method of claim 1 wherein said ultraviolet wavelengths are selected from a range of 220-500 nanometers.

4. The method of claim 1 where said photoresist is diazoketone/novolac positive resist.

5. The method of claim 2 wherein said dosage includes a range of 0 to 1000 millijoules per centimeter squared.

6. The method of claim 2 wherein said ultraviolet wavelengths are selected from a range of 220-500 nanometers.

7. The method of claim 2 wherein said photoresist is a diazoketone/novolac positive resist.

* * * * *